United States Patent
Fulford, Jr. et al.

[11] Patent Number: 6,051,510
[45] Date of Patent: Apr. 18, 2000

[54] METHOD OF USING A HARD MASK TO GROW DIELECTRICS WITH VARYING CHARACTERISTICS

[75] Inventors: H. Jim Fulford, Jr.; James Francis Buller, both of Austin, Tex.

[73] Assignee: Advanced Micro Devices, Inc., Sunnyvale, Calif.

[21] Appl. No.: 08/850,854

[22] Filed: May 2, 1997

[51] Int. Cl.$^7$ ................................. H01L 21/31
[52] U.S. Cl. .................... 438/778; 438/784; 438/791
[58] Field of Search .................... 438/281, 296, 438/313, 314, 317, 319, 586, 634, 305, 910, 778, 784, 791

[56] References Cited

U.S. PATENT DOCUMENTS

| | | | |
|---|---|---|---|
| 4,352,117 | 9/1982 | Cuomo et al. | 357/30 |
| 5,254,489 | 10/1993 | Nakata | 437/40 |
| 5,296,411 | 3/1994 | Gardner et al. | 437/238 |
| 5,316,981 | 5/1994 | Gardner et al. | 437/235 |
| 5,330,920 | 7/1994 | Soleimani et al. | 437/24 |
| 5,362,685 | 11/1994 | Gardner et al. | 437/238 |
| 5,387,540 | 2/1995 | Poon et al. | 438/281 |
| 5,498,577 | 3/1996 | Fulford, Jr. et al. | 437/228 |
| 5,591,681 | 1/1997 | Wristers et al. | 437/240 |
| 5,604,159 | 2/1997 | Cooper et al. | 438/281 |
| 5,637,520 | 6/1997 | Cappelletti et al. | 438/258 |
| 5,672,521 | 9/1997 | Barsan et al. | 437/24 |
| 5,683,925 | 11/1997 | Irani et al. | 437/45 |
| 5,851,893 | 12/1998 | Gardner et al. | 438/305 |
| 5,861,347 | 1/1999 | Maiti et al. | 438/787 |

OTHER PUBLICATIONS

Yoshikawa et al., "An EPROM Cell Structure for EPLD's Compatible with Single Poly–Si Gate Process," IEEE Transactions on Electron Devices, vol. 37, No. 3, Mar. 1990, pp. 675–679.

Han et al., "RTP NO–Nitridation of Ultrathin $SiO_2$ for Superior Device Reliability and Suppressed Boron Penetration in Advanced Dual–Gate CMOS Logic Application," Microelectronics Research Center, Department of Electrical Computer Engineering, The University of Texas at Austin, 5 pages.

*Primary Examiner*—David Nelms
*Assistant Examiner*—Renee' R. Berry
*Attorney, Agent, or Firm*—Conley, Rose & Tayon P.C.

[57] ABSTRACT

A method of employing an ambient diffusion barrier to isolate a first dielectric on a silicon substrate against further growth during formation of a second dielectric on the silicon substrate. Subsequent to formation of the diffusion barrier, an exposed surface area of the silicon substrate is subjected to a dielectric forming ambient. The dielectric forming ambient reacts with the exposed silicon surface to form the second dielectric. However, since the first dielectric is isolated, the dielectric forming ambient cannot diffuse therethrough and react with the silicon underlying the first dielectric thereby precluding any further growth in the first dielectric. Using this method, the first and second dielectrics can be formed with differing cross-sectional thicknesses or differing materials.

17 Claims, 10 Drawing Sheets

METHOD OF USING A HARD MASK TO GROW DIELECTRICS WITH VARYING CHARACTERISTICS

BACKGROUND OF THE INVENTION

1. Field of the Invention

This invention relates to semiconductor fabrication, and more particularly, to a method of isolating a first dielectric prior to formation of a second dielectric.

2. Description of the Relevant Art

Fabrication of metal oxide semiconductor (MOS) transistors is well known. The fabrication process begins by defining active areas on a semiconductor substrate where transistors will be formed. The active areas are isolated from each other on the semiconductor substrate by various isolation structures. Isolation structures come in many forms. For example, isolation structures can be formed by etching trenches into the substrate and filling them with a dielectric material. Isolation structures may also be formed by locally oxidizing the substrate using the well known LOCOS technique.

Once the isolation structures are defined between transistor active areas, a gate and insulating dielectric are formed. Typically, dielectric formation involves thermally oxidizing the silicon substrate by exposing the substrate to an oxygen bearing, heated ambient, in, for example, an oxidation furnace or a rapid thermal anneal (RTA) chamber. The oxygen reacts with the silicon substrate surface to form a thin layer of the dielectric (silicon dioxide) thereon. A gate conductor material is then deposited over the dielectric. Preferably, the gate is formed from polycrystalline silicon, or polysilicon. The polysilicon is then patterned using a photolithography mask.

An N-channel transistor, or N-MOS transistor, must in most instances be fabricated differently from a P-channel transistor, or P-MOS transistor. N-MOS transistors employ N-type dopants on opposite ends of the N-MOS gate conductor, whereas P-MOS transistors employ P-type dopants on opposite ends of the P-MOS transistor gate conductor. The regions of the substrate which receive dopants on opposite ends of the gate conductor are generally referred to as source/drain regions.

MOS transistors "turn on" and become active when appropriate voltages are applied to the gate (threshold voltage) and drain terminals. In the active state, the gate voltage creates an inversion layer or channel beneath the gate dielectric between the source/drain regions. Current conducts through this inversion layer. Often, the threshold voltage needed to create the inversion layer skews or drifts over time as will be more fully explained below.

Transistor speed and threshold voltage drift are factors affecting the design of most MOS transistors. One mechanism causing threshold voltage drift (threshold skew) relates to hot carrier effects (HCE), a phenomenon involving electric field acceleration of carriers (holes and electrons). The peak channel electric field, often referred to as the maximum field effect, occurs near the drain during normal transistor operation. The electric field near the drain causes primarily electrons in an n-channel transistor in the inversion layer to gain kinetic energy and become "hot." These hot electrons can be injected and become trapped in the gate oxide under appropriate transistor gate and drain bias voltage conditions. As a result, there is a net negative charge density in the gate dielectric, which can accumulate over time, resulting in a positive threshold voltage shift in N-MOS transistors. It is known that since hot electrons are more mobile than hot holes, HCE causes a greater threshold skew in N-MOS transistors than P-MOS transistors.

Transistor speed and HCE induced threshold voltage skew depend upon a variety of variables including (1) gate dielectric thickness, (2) gate dielectric material, and (3) gate voltage. Thinner gate dielectrics result in faster transistors but produce greater skew in threshold voltage due to HCE for a constant operating voltage. Dielectrics formed from a material which retard hot carrier injection reduce threshold voltage skew but often produce transistors which may be slower than those with gate dielectrics formed solely from silicon oxide. Lastly, higher voltages applied to the gate increase transistor speed but produce greater HCE threshold voltage skew.

It is desirable to fabricate each transistor within an integrated circuit with respect to individual parameters thereby maximizing transistor speed and minimizing HCE induced threshold voltage skew. Transistors in an integrated circuit are often contained in peripheral devices, such as translators or buffers, or in core devices, such as RAM, ROM, or circuitry. To increase overall integrated circuit speed and reliability there is a need to design gate dielectrics of core transistors differently than gate dielectrics of peripheral transistors. For example, core transistors can be made to operate faster at lower gate voltages by designing core transistors with thinner dielectrics. Peripheral transistors can be designed to withstand threshold voltage skew by making their gate dielectrics thicker.

The prior art provides a multi-step process for growing core and peripheral transistor gate dielectrics with different thicknesses. The prior art technique is described below in connection with FIGS. 1–8.

In particular, FIG. 1 shows a cross-sectional view of a wafer having a silicon substrate 10 with a first dielectric layer 12 formed thereon by subjecting, for example, silicon substrate 10 to a heated ambient containing oxygen.

FIG. 2 shows a layer of photoresist 14 formed over first dielectric layer 12. The photoresist is selectively exposed to light transmitted through a photomask plate (not shown) having opaque and light transmissive regions. Regions of the photoresist 14 exposed by photomask transmitted light are removed by subjecting the wafer to standard washing techniques. FIG. 3 shows the result of selectively exposing and removing regions of the photoresist.

The wafer is then subjected to an etching technique which removes those regions of the first dielectric 12 left unprotected by photoresist 14. The etching results are shown in FIG. 4 which exhibits a small portion of dielectric 12 aligned with a small portion of photoresist 14.

A second dielectric can be formed by again subjecting the wafer to a heated ambient containing oxygen. The oxygen reacts with those portions of the silicon substrate exposed by the prior etching step. However, before the second dielectric can be formed, the photoresist covering first dielectric 12 must be removed. This is because photoresist is a carbon based material, and if the photoresist is not removed prior to the second dielectric forming step, the photoresist will react in the high temperature oxygen ambient, the product of which will inadvertently diffuse to and contaminate the exposed surface area's wafer where the formation of the second dielectric is to occur.

FIG. 5 shows example results of removing the photoresist 14 covering dielectric 12. The photoresist removal technique occasionally does not totally remove all the photoresist material. It has been shown that the removal technique may inadvertently leave behind bits and pieces of photoresist on the surface of the dielectric 12. FIG. 5 shows an example of a residual portion 16 of a photoresist on dielectric 12 remaining after the photoresist removal.

After the photoresist removal step, as noted above, the wafer is subjected to the heated oxygen ambient to form second dielectric 20. See FIG. 6. In addition to reacting with the exposed silicon, the ambient oxygen additionally diffuses through first dielectric 12 and reacts with the silicon substrate 10 underlying the dielectric 12 thereby causing further growth of first dielectric 12. The results of forming the second dielectric 20 and further growing the first dielectric 12 is shown in FIG. 6. As can be seen, the two dielectrics have different thicknesses $t_1$ and $t_2$. Unfortunately, dielectric 12 is not uniform in thickness due to the presence of the residual photoresist 16. More particularly, the residual photoresist material 16 blocks diffusion of ambient oxygen through dielectric 12 underlying the residual photoresist material. As a result, the area of dielectric 12 underneath the residual photoresist material 16 cannot further grow resulting in a gap 18 as shown.

FIG. 7 shows a cross-sectional view of the wafer with a polysilicon layer 22 over both the first and second dielectrics 12 and 20. The polysilicon layer 22 is then selectively exposed and developed gate structures 24 as shown in FIG. 8.

The resulting gate structures 24 and dielectrics 12 and 20 ideally support remotely positioned transistors 26 and 28 (see FIG. 8) in peripheral and core devices respectively. Dielectric 12 of peripheral transistor 26 generally has a greater thickness ti when compared to the thickness $t_2$ of the dielectric 20 of core transistor 28. As such the peripheral transistor can be operated with a higher gate voltage thereby reducing threshold voltage skew created by HCE. The core transistor by virtue of its thinner dielectric 20, can be operated with a lower gate voltage which in turn reduces threshold voltage skew caused by HCE while maintaining a relatively high operational speed.

A problem, however, arises due to the residual photoresist. As can be seen in FIG. 8, the gate 24 extends into the gap 18 of dielectric 12 created by the residual photoresist 16. As a result, dielectric 12 experiences an increased electric field at that area of reduced dielectric thickness when a voltage is applied to gate 24. The increased electric field creates a greater risk that dielectric 12 will rupture at gap 18. In other words, the gap created by the residual photoresist increases the likelihood of transistor failure due to dielectric rupture. This problem is compounded by the fact that dielectric 12 is subjected to the higher gate voltages associated with peripheral devices.

The problems created by residual photoresist described above also arise during formation of single dielectrics in a device having dual thicknesses. Many modern programmable devices, including EEPROMs, may be defined by sophisticated structures having a single dielectric with multiple thicknesses. FIG. 9, for example, shows a cross-sectional view of an EEPROM having a multi-thick dielectric 30 along with program transistor 32, a buried control gate 34, a floating gate 36, a sense transistor 38, and a read transistor 40. The multi-thick dielectric 30 includes a tunnel dielectric 42 and a gate dielectric 44. Proper operation of the EEPROM requires the tunnel dielectric 42 to be significantly thinner when compared to the thickness of gate dielectric 44 for the following reasons.

The EEPROM shown in FIG. 9 can be "erased" or "programmed" by injection or removal of electrons onto floating gate 36. In the "erase" mode, high voltage is connected to both the buried control gate 34 and gate 46 of program transistor 32. Concurrently, a low voltage (ground, for example) is applied to source 48 of program transistor 32. Thus biased, a strong electric field is induced across tunnel dielectric 42 between floating gate 36 and drain 50 of program transistor 32. This strong electric field induces electrons to tunnel from drain 50 to floating gate 32 causing an accumulation of negative charge thereon. Since the floating gate 36 also acts as the gate which controls sense transistor 38, the accumulation of negative charge raises the threshold voltage of sense transistor 38 which, in turn, inhibits current flow therethrough during a subsequent "read" mode. In the program mode, the control gate 34 and the source 48 of program transistor 32 are reversed biased while program transistor is activated thereby creating a strong reverse electric field across tunnel dielectric 42. The reverse bias removes the electrons from floating gate 36 by a tunneling mechanism. The removal of the electrons lowers the threshold voltage of associated sense transistor 38 which, in turn, promotes, current flow therethrough during a subsequent "read" mode.

To achieve electron tunneling through tunnel dielectric 42 in the presence of a strong electric field, it is imperative that tunnel dielectric 42 have a relatively thin cross-sectional thickness when compared to the thickness of gate dielectric 44. Typically, a high quality EEPROM can be manufactured with tunnel dielectric 42 having a thickness of 80–100 angstroms.

Prior art techniques for forming tunnel and gate dielectrics in EEPROMs require multiple steps. The prior art technique will now be described with reference to FIGS. 10–17 which show region A of the EEPROM in FIG. 9 after successive processing steps. More particularly, FIG. 10 shows wafer having a silicon substrate 60 with a thin layer of dielectric 44 formed thereon. The dielectric may be formed by reacting the surface of silicon wafer 60 with a heated ambient containing oxygen.

Thereafter, the dielectric 44 is covered with a layer of light sensitive photoresist 62 as shown in FIG. 11. The photoresist is then selectively exposed to light transmitted through a photomask plate (not shown) having opaque and light transmissive regions. Light exposed regions of the photoresist 62 are removed by subjecting the wafer to a washing technique. FIG. 12 shows the result of the exposing and removing steps to create a window 64 through photoresist 62 to expose dielectric 44.

The wafer is then subjected to an etching technique which removes regions of dielectric 44 exposed by window 64, the results of which are shown in FIG. 13. This provides an area on the silicon substrate surface where tunnel dielectric 42 can be grown. Before the tunnel dielectric 42 can be formed, the photoresist material 62 must be removed since photoresist is formed from a carbon-based material and will react in the high temperature oxygen containing environment needed to form the tunnel dielectric, the product of which will inadvertently diffuse into the exposed surface of the substrate area and preclude any formation of tunnel dielectric thereon.

The photoresist removal technique occasionally does not remove all of the photoresist material. It has been shown the removal technique may inadvertently leave behind bits and pieces of photoresist on the surface of the wafer. FIG. 14 shows examples 66 of residual photoresist particles remaining on the surface of dielectric 44 after photoresist removal.

After photoresist removal, the wafer is subjected to a second dielectric formation step to form the tunnel dielectric 42 on the exposed area. In this step, like the step for forming the gate dielectric 44, the tunnel dielectric 42 is formed by subjecting the wafer to an ambient containing oxygen at elevated temperatures. In addition to reacting with the exposed silicon substrate, the ambient oxygen diffuses through gate dielectric 44 and reacts with the silicon thereunder resulting in further growth the gate dielectric 44. FIG. 15 shows the results of the formation of the tunnel dielectric 42 and the further growth of gate dielectric 44. However, as can be seen in FIG. 15, the resulting thickness $t_1$ of gate dielectric 44 is non-uniform due to gaps 68 created by the presence of photoresist particles 66 inadvertently remaining after the photoresist removal step. The particles 66 inhibit diffusion of oxygen through gate dielectric 44 during the second oxidation step. Accordingly, the silicon beneath the particles 66 cannot react with oxygen and cause further growth of gate dielectric 44.

FIGS. 16 and 17 show the results of depositing polysilicon and selective etching thereof to form floating gate 36 and gate 46 of program transistor 32.

As can be seen in FIG. 17, gate 46 extends into gate dielectric 44 due to the gaps 68. In operation, gate 46 is subjected to high voltages during the "programming" and "erasing" of the EEPROM. These voltages produce an electric field across gate dielectric 44, which is directly proportional to the inverse of the thickness of the underlying gate dielectric. During the "programming" and "erasing" modes, gate dielectric 44 is subjected to an unanticipated high electric field at areas of reduced thickness (i.e., the gaps 68 created due to the residual photoresist). These high electric fields may cause the dielectric to break down or rupture which in turn may render program transistor 32 inoperable.

SUMMARY OF THE INVENTION

The problems outlined above are in large part solved by the present invention of employing a hard mask or diffusion barrier to isolate one dielectric during the formation of another dielectric. In accordance with the present invention, a first dielectric is formed by subjecting a silicon substrate to a dielectric forming ambient. The first dielectric is then isolated by depositing a diffusion barrier, such as a layer of nitride, over the first dielectric. Thereafter, a second dielectric is formed on a second area of the silicon substrate by subjecting the silicon substrate to the same dielectric forming ambient used to form the first dielectric. Alternatively, a different dielectric forming ambient can be used to form the second dielectric. Since the first dielectric is isolated, the first dielectric experiences no further growth during formation of the second dielectric. As such, the second dielectric can be grown to a different thickness or, when using a different dielectric forming ambient, formed of a different material such as one which is more resistant to hot carrier effects.

One advantage of the present invention is that it produces separate dielectrics of different thicknesses.

Another advantage of the present invention is that it produces a single dielectric with varying thickness.

Another advantage of the present invention is that it produces dielectrics formed of different materials.

Another advantage of the present invention is that it produces dielectrics having more consistent cross-sectional thicknesses.

Another advantage of the present invention is that it produces more reliable semiconductor devices.

Yet another advantage of the present invention is that it allows dielectrics of transistors to be designed individually in order to maximize performance thereof.

BRIEF DESCRIPTION OF THE DRAWINGS

Other objects and advantages of the invention will become apparent upon reading the following detailed description and upon reference to the accompanying drawings in which.

Figure 1:
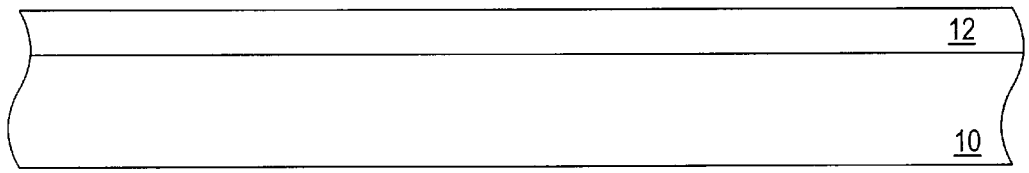
FIG. 1 is a cross-sectional view of a wafer having a first dielectric layer formed thereon.
Figure 2:
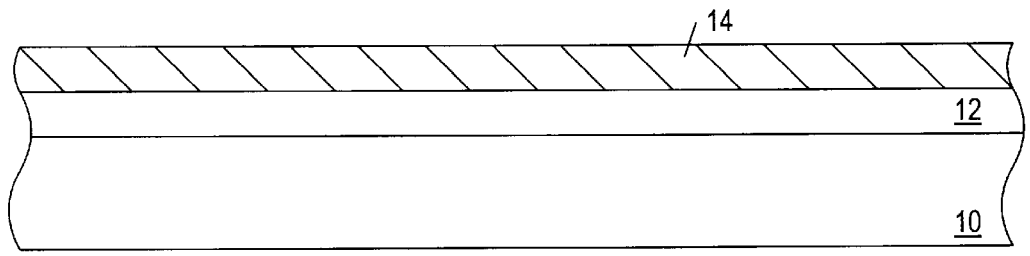
FIG. 2 is a cross-sectional view of a wafer having a photoresist layer and a first dielectric layer formed thereon.
Figure 3:
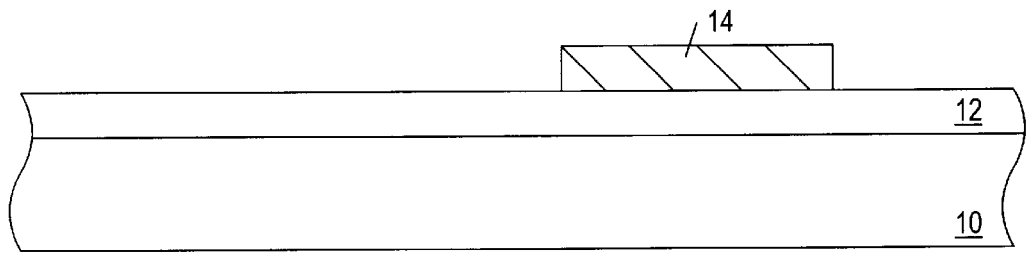
FIG. 3 is a cross-sectional view of a wafer having a first dielectric layer and an etched photoresist layer formed thereon.
Figure 4:
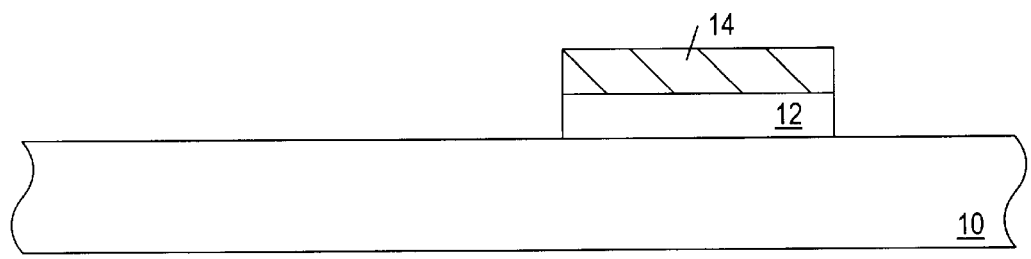
FIG. 4 is a cross-sectional view of a wafer having an etched photoresist layer and a first dielectric layer formed thereon.
Figure 5:
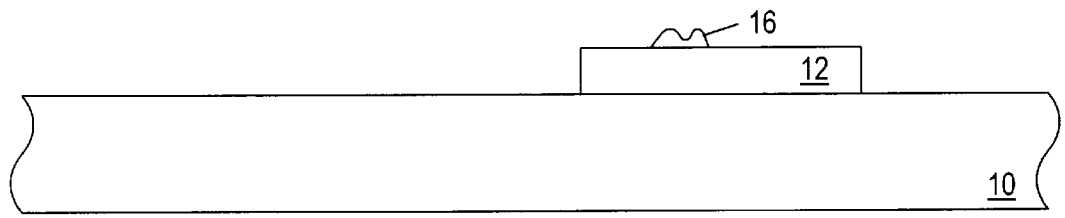
FIG. 5 is a cross-sectional view of a wafer having an etched first dielectric layer formed thereon.
Figure 6:
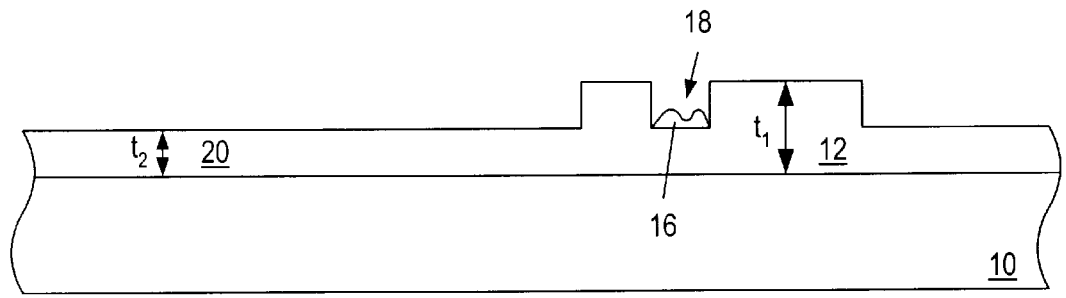
FIG. 6 is a cross-sectional view of a wafer having an etched first dielectric layer and second dielectric layer formed thereon.
Figure 7:
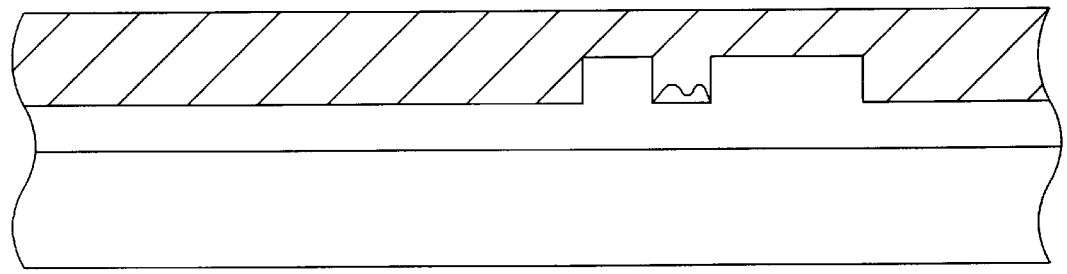
FIG. 7 is a cross-sectional view of a wafer having a first etched dielectric layer, second dielectric layer, and a photoresist layer formed thereon.
Figure 8:
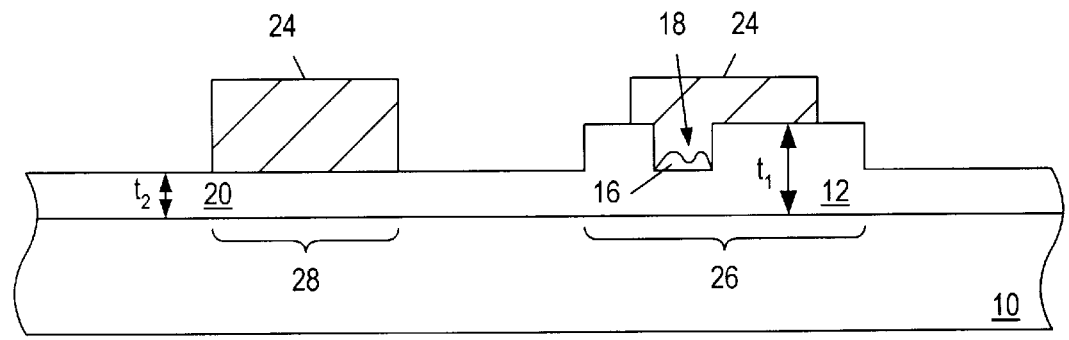
FIG. 8 is a cross-sectional view of a wafer having an etched photoresist layer, an etched first dielectric layer and a second dielectric layer formed thereon.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents, and alternatives falling within the spirit and scope of the present invention as defined by the appended claims.

DETAILED DESCRIPTION OF THE INVENTION

Figure 18:
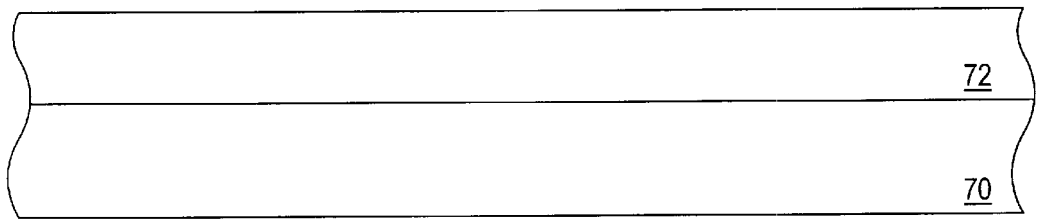
FIG. 18 is a cross-sectional view of a wafer having a first dielectric layer formed thereon.

The present invention is described in connection with FIG. 18–28 which show cross-sectional views of silicon wafers after successive process steps to form dielectrics for separate transistors wherein the dielectrics have differing thicknesses and/or materials. FIG. 18 is a cross-sectional view of a silicon substrate 70 having a first dielectric 72 formed thereon. The first dielectric 72 can be formed by subjecting the surface of silicon substrate 70 to a dielectric forming ambient at elevated temperatures. First dielectric 72 will be described as being formed in an ambient containing nitrogen, it being understood that first dielectric 72 need not be formed in an ambient containing nitrogen. Nitrogen, however, is useful since it collects at the resulting dielectric/silicon interface. The interfacial nitride reduces effects of injection of hot carriers into the dielectric and thereby reduce HCE threshold voltage skew in the resulting transistor.

Figure 19:
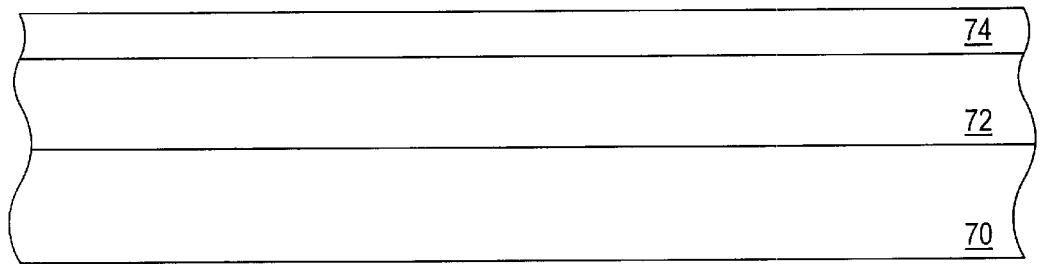
FIG. 19 is a cross-sectional view of a wafer having a nitride layer and a first dielectric layer formed thereon.

Thereafter the first dielectric 72 is isolated with an ambient diffusion barrier 74 as shown in FIG. 19. The diffusion barrier 74 acts to inhibit diffusion of ambient used in subsequent process steps particularly those used to grow other dielectric layers on substrate 70. In one embodiment, diffusion barrier 74 is formed by depositing silicon nitride by standard CVD using silicon nitride stock.

Figure 20:
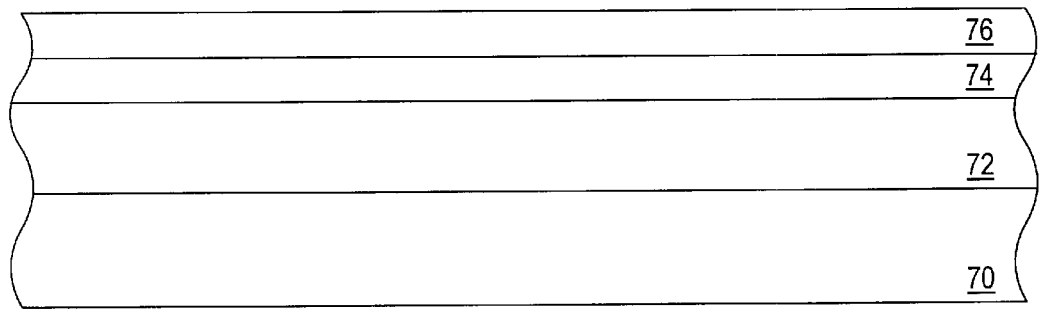
FIG. 20 is a cross-sectional view of a wafer having a photoresist layer, a nitride, and a first dielectric layer formed thereon.
Figure 21:
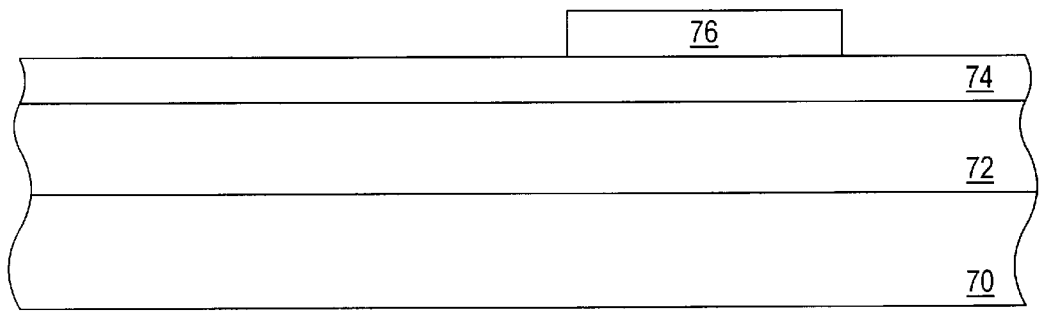
FIG. 21 is a cross-sectional view of a wafer having a nitride layer, a first dielectric layer, and an etched photoresist layer formed thereon.

FIG. 20 shows a cross-sectional view of the wafer coated with a layer of photoresist 76. Thereafter photoresist layer 76 is patterned using standard techniques to expose a portion of diffusion barrier 74 as shown in FIG. 21.

Figure 22:
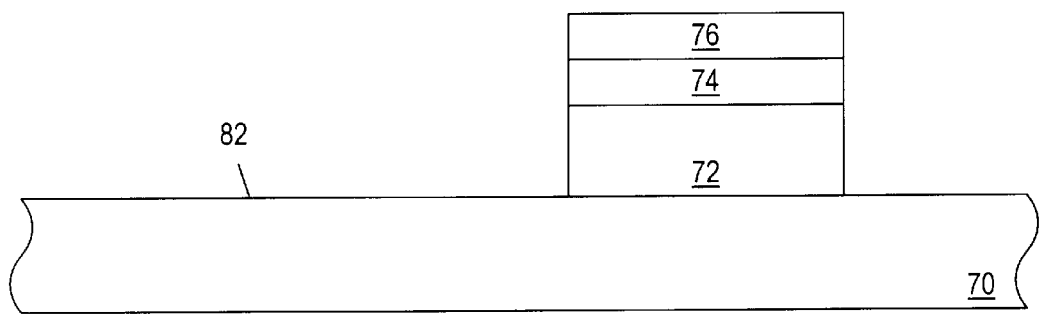
FIG. 22 is a cross-sectional view of a wafer having a first dielectric layer, an etched photoresist layer and a nitride layer formed thereon.

FIG. 22 shows the results of twice etching the wafer, a portion of diffusion barrier 74 and first dielectric 72 to expose a surface portion 82 of silicon substrate 70. As will be more fully described below, the exposed region 82 provides an area where a second dielectric 84 can be formed.

Figure 23:
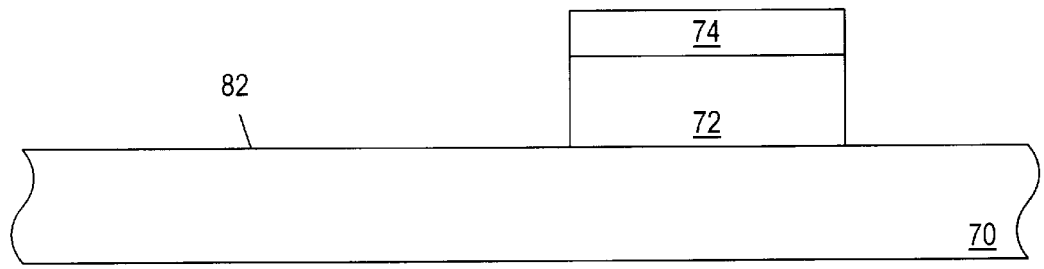
FIG. 23 is a cross-sectional view of a wafer having a first dielectric layer and an etched nitride layers formed thereon.
Figure 24:
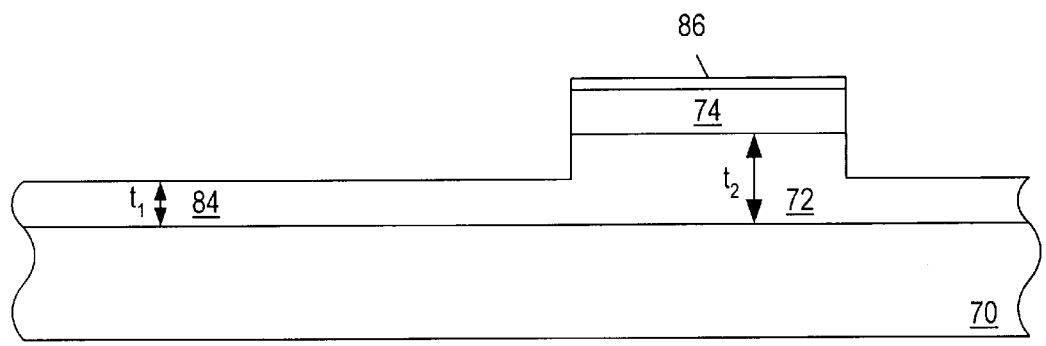
FIG. 24 is a cross-sectional view of a wafer having an etched nitride layer, an oxynitride layer, and first and second dielectric layers formed thereon.

Photoresist 76 is removed as shown in FIG. 23, and the wafer is subjected to a second dielectric forming ambient. This second ambient may be the same as or different from the ambient used to form the first dielectric. In one embodiment, the second ambient lacks nitrogen and comprises mainly oxygen. The oxygen reacts with the silicon at the exposed region 82 to form the second dielectric 84. It is to be understood, however, that the second dielectric 84 can be formed with an ambient containing other elements such as nitrogen. Second dielectric 84 is shown in FIG. 24 with a cross-sectional thickness $t_1$ approximately one-half the cross-sectional thickness $t_2$ of first dielectric 72. It is to be understood that the second dielectric can be formed with a greater or lesser thickness.

Figure 25:
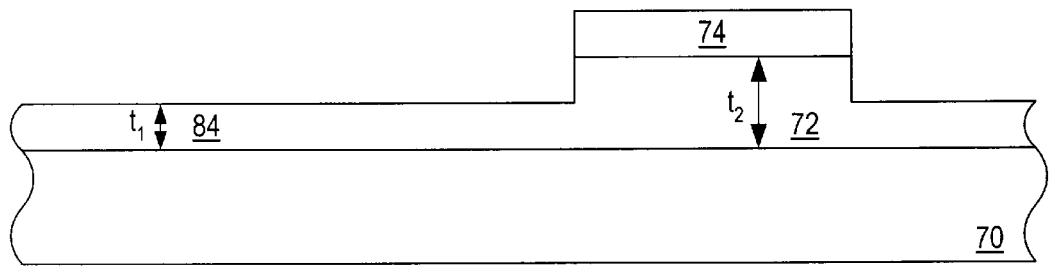
FIG. 25 is a cross-sectional view of a wafer having a first dielectric layer, or second dielectric layer, and an etched nitride layer formed thereon.

Concurrent with the formation of second dielectric 84, the oxygen based ambient reacts with nitride layer 74 to form a thin layer of oxynitride 86. In FIG. 25, the thin layer of oxynitride 86 is removed using a buffered oxide etch having a high concentration of fluorine. However, the buffered oxide etch also removes a portion of second dielectric 84 thereby reducing the cross-sectional thickness thereof.

Figure 26:
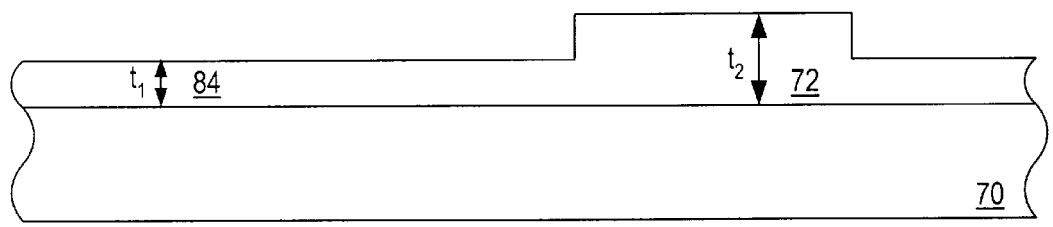
FIG. 26 is a cross-sectional view of a wafer having first and second dielectric layers formed thereon.

FIG. 26 shows a cross-sectional view of the wafer with nitride layer 84 removed therefrom using, for example, a hot phosphoric acid etch. This etching step removes the nitride layer without reducing the thickness of the first and second dielectrics 72 and 84 respectively.

Figure 27:
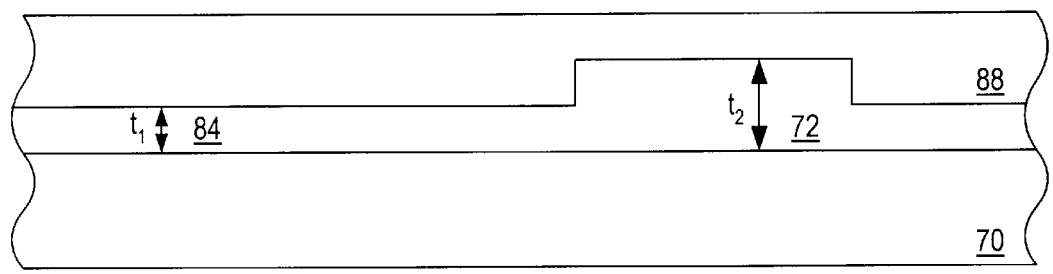
FIG. 27 is a cross-sectional view of a wafer having a first dielectric layer, a second dielectric layer, and a photoresist layer formed thereon.
Figure 28:
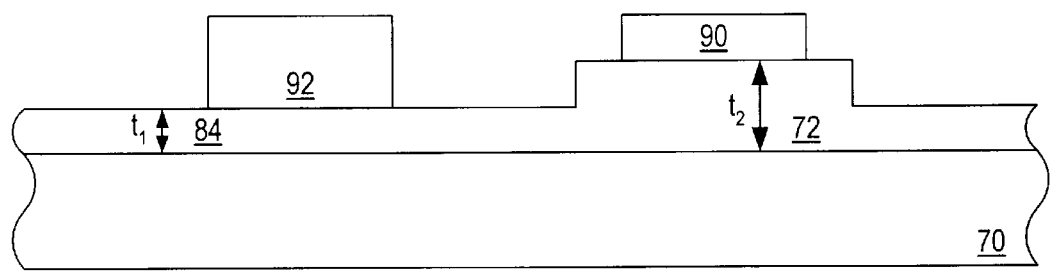
FIG. 28 is a cross-sectional view of a wafer having a first dielectric layer, a second dielectric layer, and an etched polysilicon layer formed thereon.

FIGS. 27 and 28 show the deposition and selective removal of a polysilicon 88 to form gates 90 and 92. As can be seen, gate 92 is provided with a significantly thinner dielectric 84 when compared to the dielectric 72 associated with gate 90. Given the relative thinness of second dielectric 84, the transistor controlled by gate 92 would operate substantially faster (at same voltage) when compared to the operational speed of the transistor controlled by gate 90.

Figure 9:
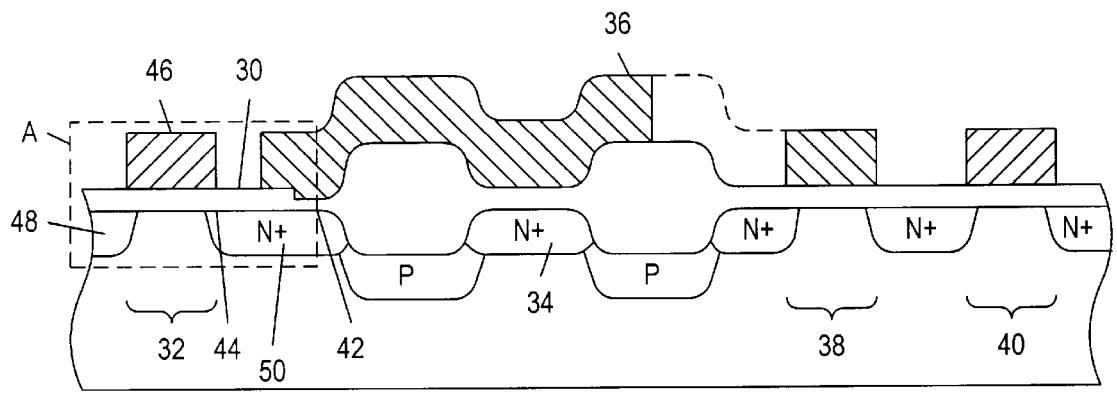
FIG. 9 is a cross-sectional view of an EEPROM.
Figure 10:
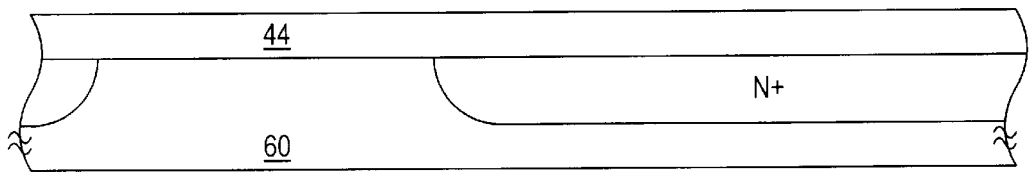
FIG. 10 is a cross-sectional view of a wafer having a dielectric layer formed thereon.
Figure 11:
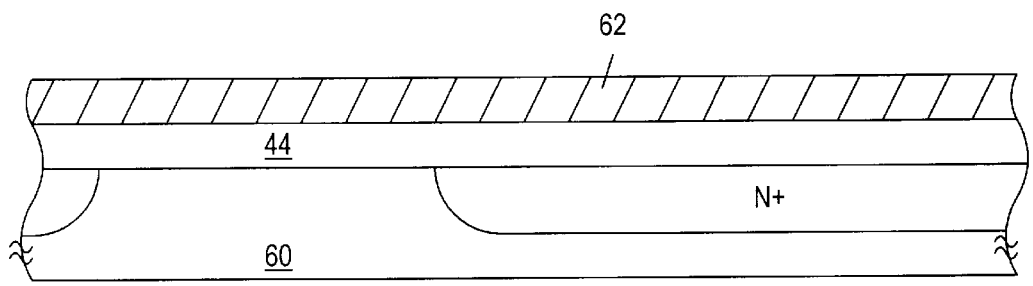
FIG. 11 is a cross-sectional view of a wafer having a photoresist layer and a dielectric layer formed thereon.
Figure 12:
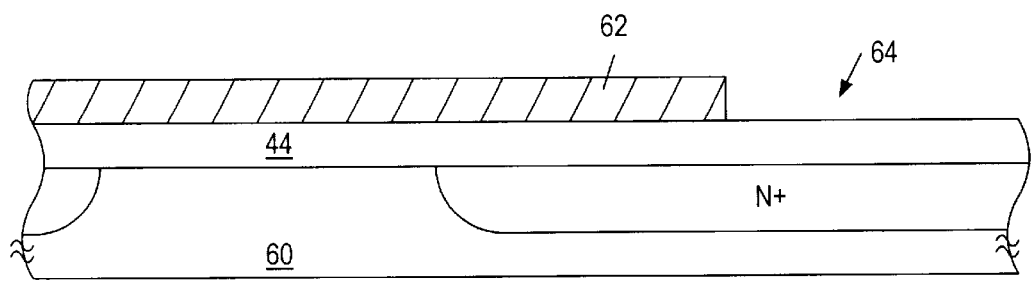
FIG. 12 is a cross-sectional view of a wafer having a dielectric layer and an etched photoresist layer formed thereon.
Figure 13:
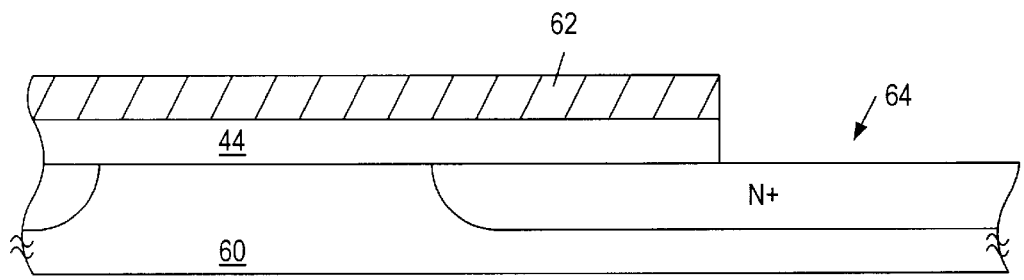
FIG. 13 is a cross-sectional view of a wafer having etched photoresist and dielectric layers formed thereon.
Figure 14:
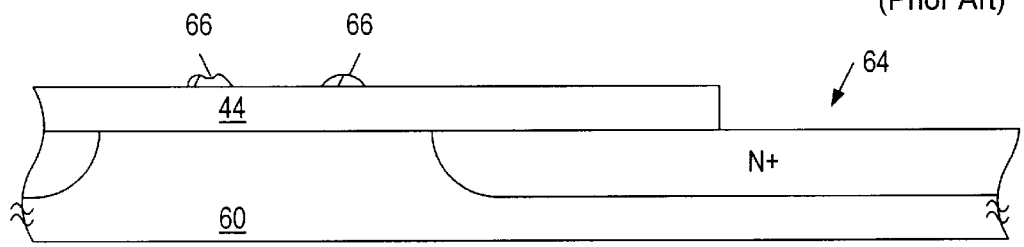
FIG. 14 is a cross-sectional view of a wafer having an etched dielectric layer formed thereon.
Figure 15:
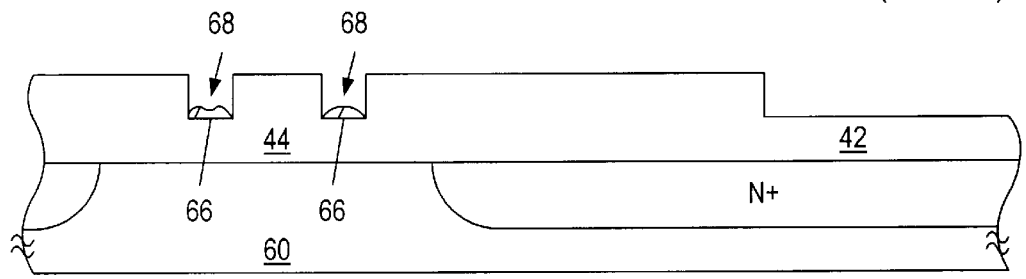
FIG. 15 is a cross-sectional view of a wafer having a dual thickness dielectric layer formed thereon.
Figure 16:
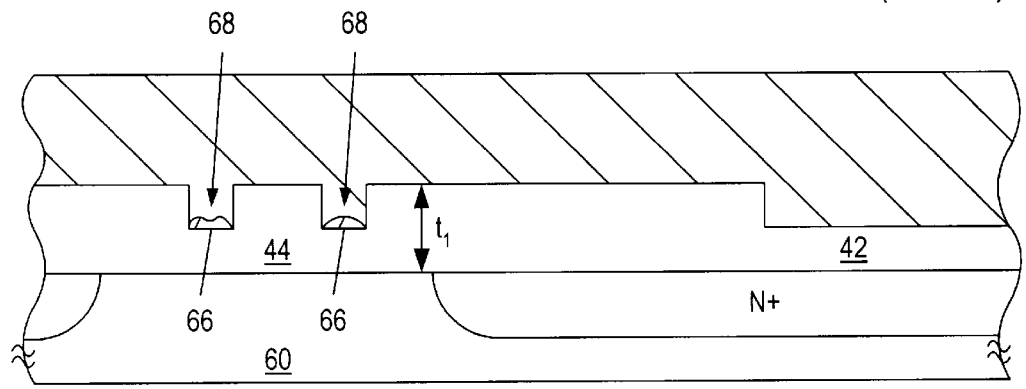
FIG. 16 is a cross-sectional view of wafer having a polysilicon layer and a dual thickness layer formed thereon.
Figure 17:
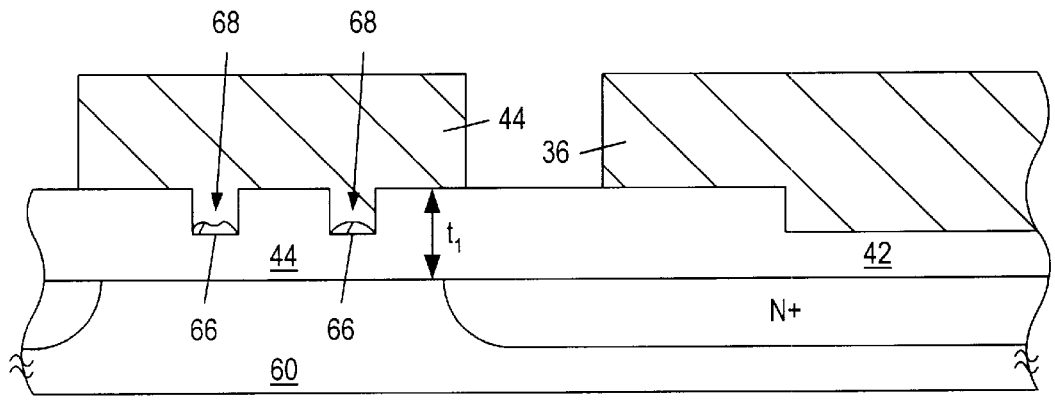
FIG. 17 is a cross-sectional view of a wafer having an etched polysilicon layer and a dual thickness dielectric layer formed thereon.

FIG. 18–28 describe the formation of separate gate dielectrics for separate transistors wherein the separate dielectrics have differing thickness and distinct materials in accordance with the present invention. FIGS. 29–40 show process step results in forming a single dielectric having dual thickness. More particularly, FIGS. 29–40 show cross-sectional views of a wafer during formation of a gate dielectric and a tunnel dielectric such as shown in the EEPROM of FIG. 9. It is to be understood, however, that the present invention is useful in the manufacture of other devices employing multi-thick dielectrics.

Figure 29:
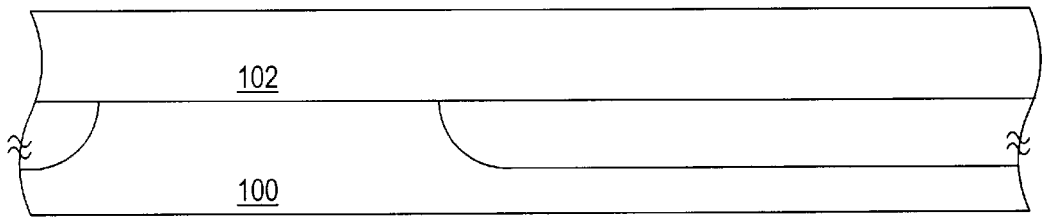
FIG. 29 is a cross-sectional view of a silicon wafer having a first dielectric layer formed thereon.
Figure 30:
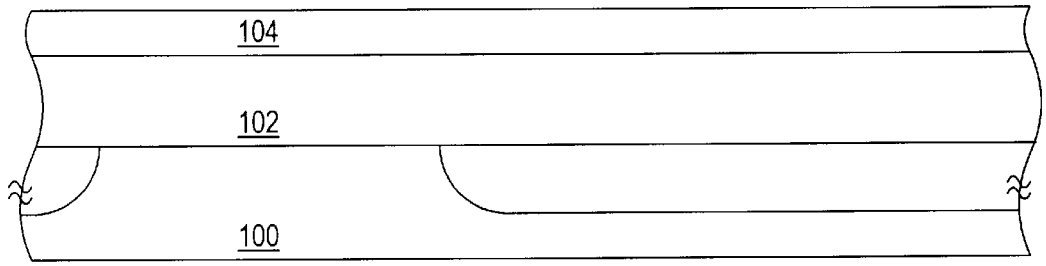
FIG. 30 is a cross-sectional view of a silicon wafer having a nitride layer, and a first dielectric layer formed thereon.

FIG. 29 is a cross-sectional view of the wafer with gate dielectric 102 formed on a silicon substrate 100. Thereafter, gate dielectric 102 is isolated with an ambient diffusion barrier 104 as shown in FIG. 30. The barrier 104 acts to inhibit diffusion of ambients used in subsequent process steps for growing additional dielectrics. In one embodiment, diffusion barrier 104 is formed from stock silicon nitride using standard CVD.

Figure 31:
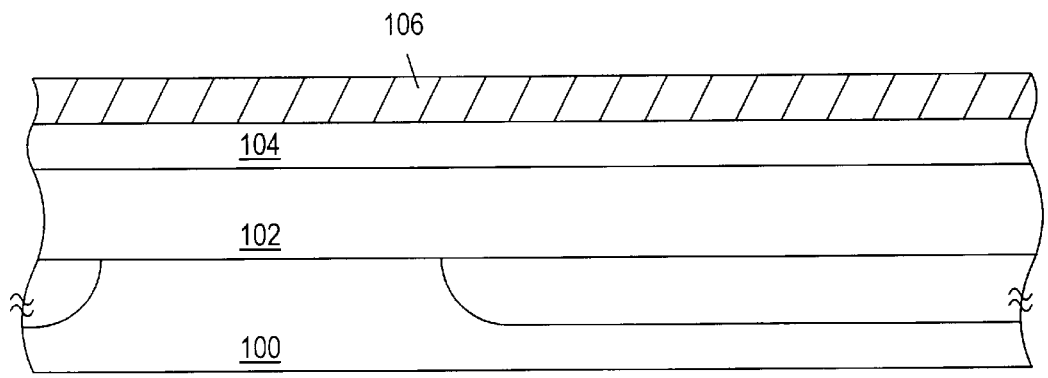
FIG. 31 shows a cross-sectional view of a silicon wafer having a first dielectric layer, a nitride layer, and a photoresist layer formed thereon.
Figure 32:
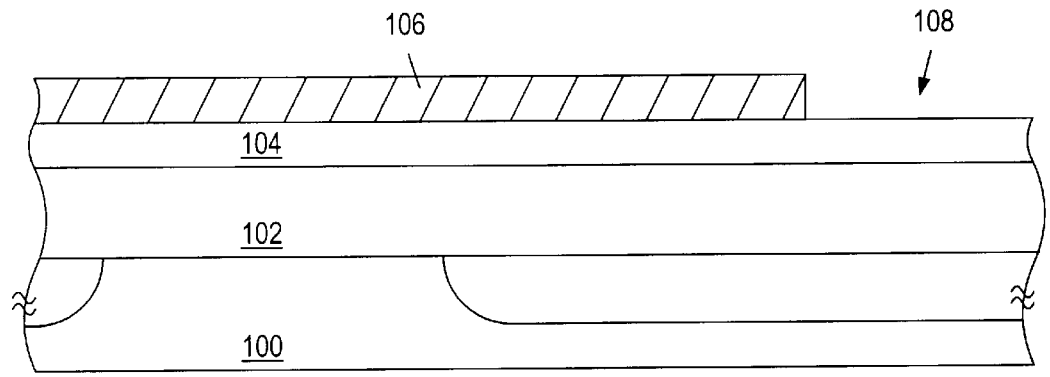
FIG. 32 is a cross-sectional view of a silicon wafer having a first dielectric layer or nitride layer, and an etched photoresist layer formed thereon.
Figure 33:
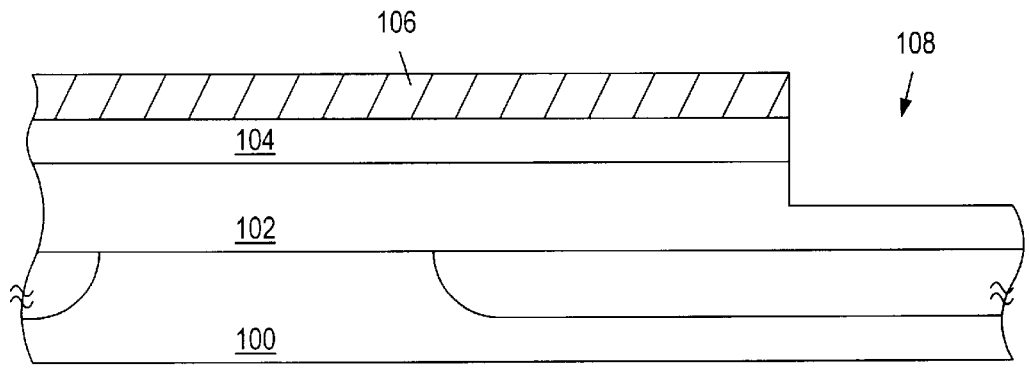
FIG. 33 is a cross-sectional view of a silicon wafer having an etched photoresist layer, a nitride layer, and a first dielectric layer formed thereon.
Figure 34:
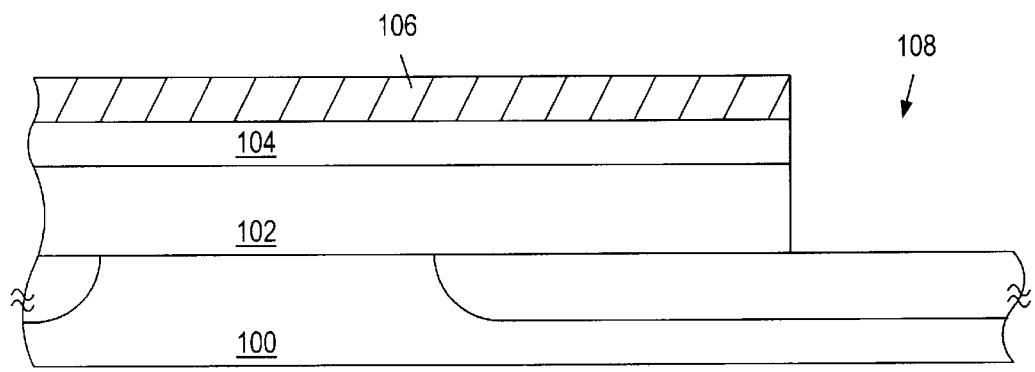
FIG. 34 is a cross-sectional view of a silicon wafer having an etched photoresist layer, nitride layer, and a first dielectric layer formed thereon.

FIG. 31 shows a cross-sectional view of the wafer with a coating of photoresist 106 thereon. In FIG. 32, photoresist layer 106 is selectively exposed to light and subsequently developed to form window 108. FIGS. 32 and 34 show a cross-sectional view of the wafer after it is subjected to successive dry and wet etching steps. Dry etching etches through nitride layer 104 and partially through gate dielectric 102. The remaining, partially etched gate dielectric is then removed by wet etching. The succession of dry and wet etching minimizes surface damage to the wafer.

Figure 35:
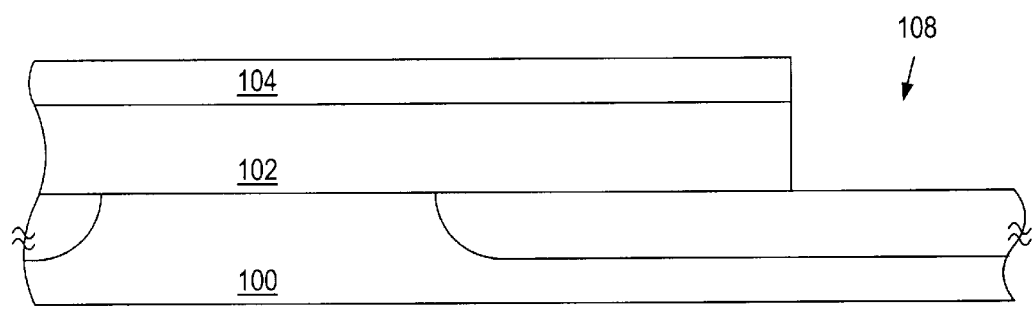
FIG. 35 is a cross-sectional view of a silicon wafer having an etched nitride layer and a first dielectric layer formed thereon.
Figure 36:
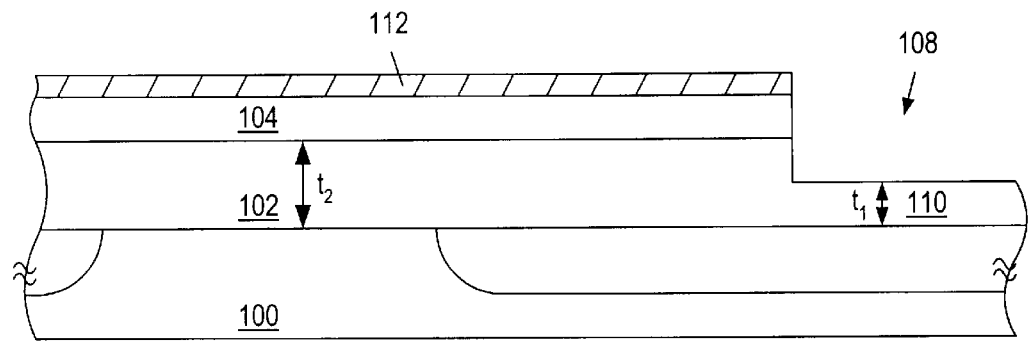
FIG. 36 is a cross-sectional view of a silicon wafer having a first dielectric layer, s second dielectric layer, oxynitride layer, and an etched nitride layer formed thereon.

In FIG. 35, the wafer is shown with the photoresist layer 106 stripped away, thereby exposing nitride 104. Thereafter, the wafer 100 is subjected to a second dielectric forming step in which the wafer is again subjected to a dielectric forming ambient. The ambient, for example, oxygen, reacts with silicon surface of the wafer exposed by window 108 thereby forming a tunnel dielectric 110 as shown in FIG. 36. Concurrent with the formation of the tunnel dielectric 110, a thin layer of oxynitride 112 forms on nitride layer 104. Gate dielectric 102, however, does not experience further growth since oxygen of the ambient cannot penetrate nitride layer 104 and react with silicon underlying gate dielectric 102. Accordingly, gate dielectric 102 maintains its pre-tunnel dielectric forming thickness. Although tunnel dielectric is shown with a thickness $t_1$ which is less than a thickness $t_2$ of gate dielectric 102, it is understood that thickness $t_1$ can be made greater than thickness $t_2$.

Figure 37:
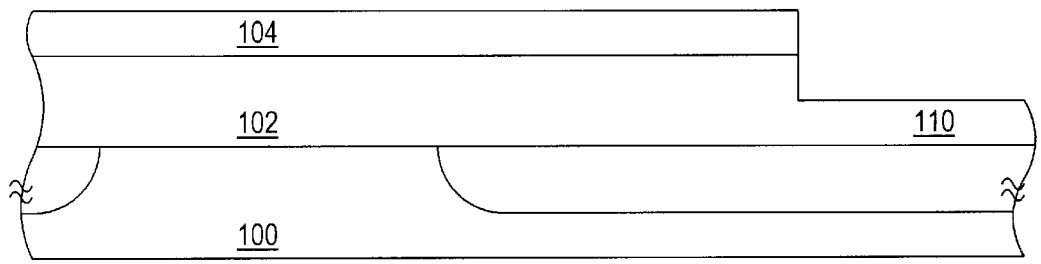
FIG. 37 is a cross-sectional view of a silicon wafer having a first dielectric layer, a second dielectric layer and an etched nitride layer formed thereon.
Figure 38:
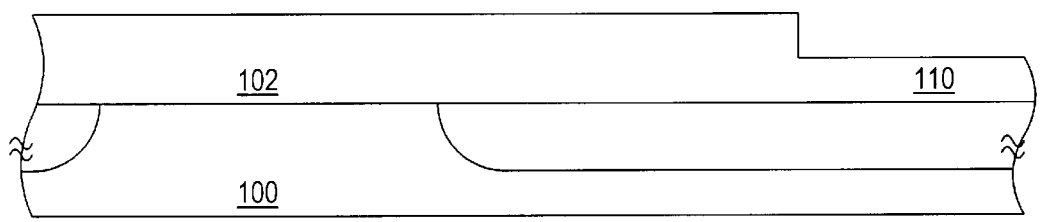
FIG. 38 is a cross-sectional view of a wafer having first and second dielectric layers formed thereon.

FIG. 37 shows the results of removing oxynitride layer 112 using a buffered oxide etch. A portion of tunnel dielectric 110 is also removed concurrent with removal of oxynitride layer 104. FIG. 38 shows the wafer 100 after removal of nitride layer 104 using hot phosphoric etch.

Figure 39:
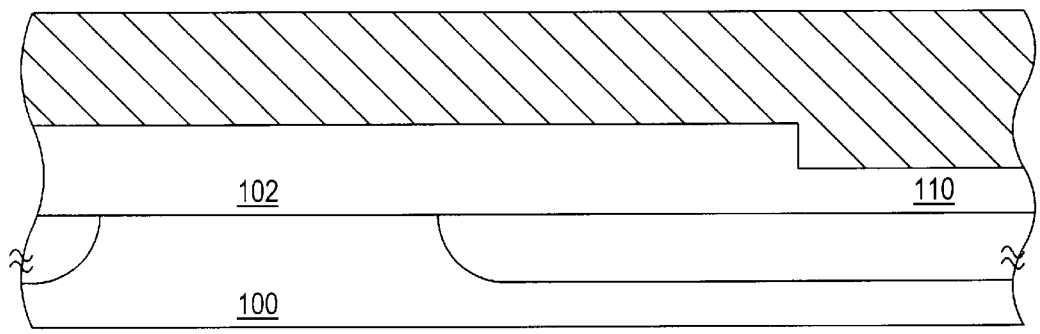
FIG. 39 is a cross-sectional view of a silicon wafer having a photoresist layer, a first dielectric layer, and a second dielectric layer formed thereon.
Figure 40:
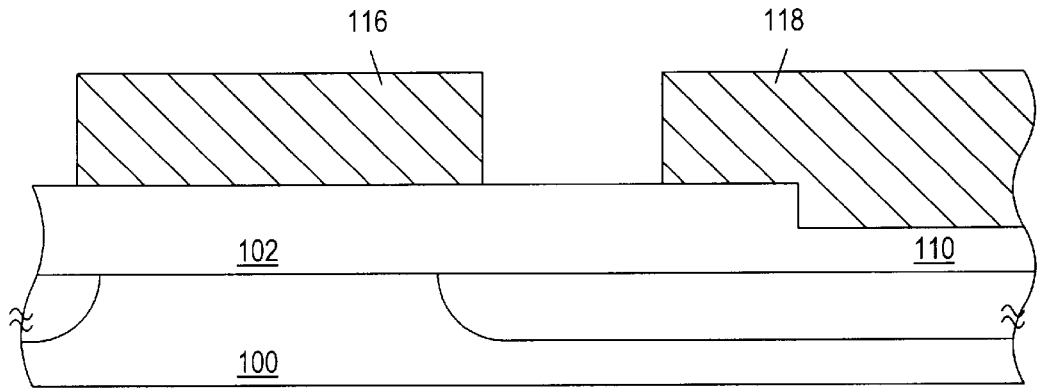
FIG. 40 is a cross-sectional view of a wafer having a first dielectric layer, a second dielectric layer and etched polysilicon layer formed thereon.

Lastly, polysilicon 114 is deposited and selectively etched to form control gate 116 and floating gate 118 of the EEPROM as shown in FIGS. 39 and 40. It is to be noted, however, that the cross-sectional thickness of gate dielectric 102 made in accordance with the present invention, is significantly more uniform than the cross-sectional thicknesses of gate dielectrics made in accordance with the prior art since there are no residual photoresist created gaps. As such, the gate dielectric made in accordance with the present invention is less susceptible to ruptures during operation of the EEPROM.

It will be appreciated by those skilled in the art having the benefit of this disclosure that this invention is believed capable of forming single or separate dielectrics having unequal thicknesses or different materials. Numerous variations and modifications will become apparent to those skilled in the art once the above disclosure is fully appreciated. It is intended that the following claims be interpreted to embrace all such modifications and changes.

What is claimed is:

1. A method of forming first and second dielectrics on a silicon substrate, the method comprising the steps:

forming a first dielectric on a first surface area of the substrate;

forming an ambient diffusion barrier on the first dielectric layer, and;

forming a second dielectric on a second surface area of the substrate subsequent to forming the ambient diffusion barrier on the first dielectric layer;

wherein the first and second surface areas are substantially contained in a single plane.

2. The method of claim 1 wherein the first dielectric is formed with a first substantially uniform cross sectional thickness, and the second dielectric is formed with a second substantially uniform cross sectional thickness, wherein the first and second substantially uniform cross sectional thicknesses are unequal.

3. The method of claim 1 wherein the first and second dielectrics are laterally spaced from each other.

4. The method of claim 1 wherein the first and second dielectrics are positioned adjacent each other so that the first and second dielectrics engage.

5. The method of claim 1 wherein the first dielectric is formed by reacting the first substrate surface area with a first ambient and the second dielectric is formed by reacting the second substrate surface area with a second ambient, wherein the first ambient has a chemical composition different than a chemical composition of the second ambient.

6. The method of claim 5 wherein one of the first and second dielectrics contain a hot carrier injection inhibiting barrier.

7. The method of claim 5 wherein one of the first and second ambients contain nitrogen.

8. The method of claim 7 wherein one of the first and second ambients contain a gas chosen form the group consisting of NO, $N_2O$, $NH_3$, $NH_4$, and $NF_3$.

9. The method of claim 1 further comprising the step of etching through the first dielectric and the ambient diffusion barrier to expose the second substrate surface area of the substrate where the second dielectric is to be formed.

10. In an integrated circuit fabrication process, a method of forming dielectrics on a surface of a semiconductor body, comprising the steps:

forming a first dielectric on a first surface area of the semiconductor body;

forming a silicon nitride on the first dielectric, and;

forming a second dielectric on a second surface area of the semiconductor body subsequent to forming the layer of silicon nitride;

wherein the first and second surface areas are substantially contained in a single plane.

11. The method of claim 10 wherein forming the first dielectric includes exposing the first surface area to a first dielectric forming ambient, and wherein forming the second dielectric includes exposing the second surface area to a second dielectric forming ambient, wherein the first and second dielectric forming ambients are different in chemical composition.

12. The method of claim 10 wherein one of the first and second dielectrics contain a hot carrier injection barrier.

13. The method of claim 11 wherein one of the first and second dielectric forming ambients contains nitrogen.

14. The method of claim 13 wherein one of the first and second dielectric froming ambients contains a gas chosen from the group consisting of NO, $N_2O$, $HH_3$, and $NF_3$.

15. wherein the first dielectric is formed having a first substantially uniform cross sectional thickness, and the second dielectric is formed having a second substantially uniform cross sectional thickness, wherein the first and second substantially uniform cross sectional thicknesses are unequal.

16. The method of claim 10 further comprising selectively removing a region of the first dielectric to expose the second surface area where the second dielectric is to be formed.

17. The method of claim 10 further comprising selectively removing a region of the silicon nitride layer to expose the second surface area where the second dielectric is to be grown.

* * * * *

UNITED STATES PATENT AND TRADEMARK OFFICE
CERTIFICATE OF CORRECTION

PATENT NO. : 6,051,510
DATED : April 18, 2000
INVENTOR(S) : Fulford et al.

It is certified that error appears in the above-indentified patent and that said Letters Patent is hereby corrected as shown below:

Claim 14, col. 10, line 63, please delete "froming" and substitute --forming--.

Signed and Sealed this

Tenth Day of April, 2001

Attest:

NICHOLAS P. GODICI

Attesting Officer

Acting Director of the United States Patent and Trademark Office